United States Patent
Lee

(10) Patent No.: US 9,373,394 B2
(45) Date of Patent: Jun. 21, 2016

(54) REFERENCE COLUMN OF SEMICONDUCTOR MEMORY, AND ELECTRONIC DEVICE INCLUDING THE SAME

(71) Applicant: SK hynix Inc., Icheon-Si (KR)

(72) Inventor: Ji-Wang Lee, Icheon-si (KR)

(73) Assignee: SK hynix Inc., Icheon-Si (KR)

( * ) Notice: Subject to any disclaimer, the term of this patent is extended or adjusted under 35 U.S.C. 154(b) by 162 days.

(21) Appl. No.: 14/191,416

(22) Filed: Feb. 26, 2014

(65) Prior Publication Data

US 2014/0241041 A1    Aug. 28, 2014

(30) Foreign Application Priority Data

Feb. 28, 2013    (KR) ........................ 10-2013-0022135

(51) Int. Cl.
     *G11C 13/00*      (2006.01)

(52) U.S. Cl.
     CPC .......... *G11C 13/004* (2013.01); *G11C 13/0004* (2013.01); *G11C 13/0007* (2013.01); *G11C 2013/0054* (2013.01); *G11C 2213/79* (2013.01)

(58) Field of Classification Search
     CPC ............. G11C 13/0002; G11C 13/004; G11C 13/0069

USPC ........................................................ 365/148
See application file for complete search history.

(56) References Cited

U.S. PATENT DOCUMENTS

| | | | | |
|---|---|---|---|---|
| 2008/0225603 | A1* | 9/2008 | Hein ..................... | G11C 7/1051 365/189.05 |
| 2010/0082898 | A1* | 4/2010 | Mangold ................. | G06F 12/02 711/113 |
| 2011/0289388 | A1* | 11/2011 | Nelson ............... | G11C 11/5642 714/773 |
| 2014/0063930 | A1* | 3/2014 | Willey ............... | G11C 13/0069 365/163 |

FOREIGN PATENT DOCUMENTS

| | | |
|---|---|---|
| KR | 10-2005-0068806 | 7/2005 |
| KR | 10-2010-0122600 | 11/2010 |

\* cited by examiner

*Primary Examiner* — Hoai V Ho
*Assistant Examiner* — Tri Hoang
(74) *Attorney, Agent, or Firm* — Perkins Coie LLP

(57) ABSTRACT

A reference column of a semiconductor memory includes a reference bit line; a reference source line; and first to $N^{th}$ resistive memory cells disposed between the reference bit line and the reference source line. Data of a first state is stored in the first resistive memory cell and data of a second state is stored in the $N^{th}$ resistive memory cell before a read operation, and the first and $N^{th}$ resistive memory cells form current paths between the reference bit line and the reference source line in the read operation.

17 Claims, 10 Drawing Sheets

REFERENCE COLUMN OF SEMICONDUCTOR MEMORY, AND ELECTRONIC DEVICE INCLUDING THE SAME

CROSS-REFERENCE TO RELATED APPLICATIONS

The present application claims priority of Korean Patent Application No. 10-2013-0022135, entitled "REFERENCE COLUMN, SEMICONDUCTOR DEVICE, PROCESSOR AND SYSTEM," and filed on Feb. 28, 2013, which is incorporated herein by reference in its entirety.

TECHNICAL FIELD

This patent document relates to memory circuits or devices and their applications in electronic devices or systems.

BACKGROUND

Recently, as electronic devices or appliances trend toward miniaturization, low power consumption, high performance, multi-functionality, and so on, there is a demand for semiconductor devices capable of storing information in various electronic devices or appliances such as a computer, a portable communication device, and so on, and research and development for such semiconductor devices have been conducted. Examples of such semiconductor devices include semiconductor devices which can store data using a characteristic switched between different resistance states according to an applied voltage or current, and can be implemented in various configurations, for example, an RRAM (resistive random access memory), a PRAM (phase change random access memory), an FRAM (ferroelectric random access memory), an MRAM (magnetic random access memory), an E-fuse, etc.

SUMMARY

The disclosed technology in this patent document includes memory circuits or devices and their applications in electronic devices or systems and various implementations of an electronic device in which an electronic device capable of generating precise reference current using only one reference column is provided.

In one aspect, a reference column of a semiconductor memory is provided. The reference column may include: a reference bit line; a reference source line; and first to $N^{th}$ resistive memory cells disposed between the reference bit line and the reference source line, wherein data of a first state is stored in the first resistive memory cell and data of a second state is stored in the $N^{th}$ resistive memory cell before a read operation, and the first and $N^{th}$ resistive memory cells form current paths between the reference bit line and the reference source line in the read operation.

In some implementations, in the read operation, the second to $N-1^{th}$ resistive memory cells may not form any current paths between the reference bit line and the reference source line.

In some implementations, the first to $N^{th}$ resistive memory cells may be disposed in a direction of the reference bit line, and the first resistive memory cell and the $N^{th}$ resistive memory cell may be formed at two ends among the first to $N^{th}$ resistive memory cells.

In some implementations, each of the first to $N^{th}$ resistive memory cells may include: a resistance variable element configured to be changed in its resistance value according to a logic value of data stored therein; and a switch element configured to be coupled in series to the resistance variable element.

In some implementations, in the read operation, switch elements of the first resistive memory cell and the $N^{th}$ resistive memory cell may be turned on, and switch elements of the second to $N-1^{th}$ resistive memory cells may be turned off.

In some implementations, the resistance variable element may include a metal oxide or a phase change substance, and a tunnel barrier layer is interposed between two ferromagnetic layers.

In some implementations, the reference bit line and the reference source line may be formed parallel to each other.

In another aspect, an electronic device is provided to include a semiconductor memory that includes: a plurality of normal columns each including a plurality of resistive memory cells; a reference column including a plurality of resistive memory cells in which, before performing a read operation, data of a first state is stored in one of resistive memory cells disposed at two ends of the reference column and data of a second state is stored in the other resistive memory cell; and a data sensing circuit configured to sense data using current flowing through a normal column selected among the plurality of normal columns and current flowing through the reference column, in the read operation.

In some implementations, in the read operation, current may flow through a selected resistive memory cell in the selected normal column, and current may flow through the resistive memory cells disposed at two ends in the reference column.

In some implementations, the reference column may include: a reference bit line; a reference source line; and a plurality of resistive memory cells disposed between the reference bit line and the reference source line. In some implementations, in the read operation, current paths may be formed through the resistive memory cells disposed at two ends between the reference bit line and the reference source line.

In some implementations, each of the plurality of resistive memory cells may include: a resistance variable element configured to be changed in its resistance value according to a logic value of data stored therein; and a switch element configured to be coupled in series to the resistance variable element.

In some implementations, the data sensing circuit may include: a pre-sensing unit configured to generate a first voltage corresponding to the current flowing through the selected normal column; a reference voltage generation unit configured to generate a second voltage corresponding to the current flowing through the reference column; and a comparison unit configured to compare the first voltage and the second voltage and generate data In some implementations, the resistance variable element may include a metal oxide or a phase change substance, and a tunnel barrier layer may be interposed between two ferromagnetic layers.

In another aspect, a reference column of a semiconductor memory is provided. The reference column may include: a reference bit line; a reference source line; and first to $N^{th}$ resistive memory cells disposed in parallel between the reference bit line and the reference source line, wherein data of a first state is stored in the first resistive memory cell and data of a second state is stored in the $N^{th}$ resistive memory cell before a read operation, and the first and $N^{th}$ resistive memory cells form current paths between the reference bit line and the reference source line to have different currents in the read operation.

In some implementations, in the read operation, the second to $N-1^{th}$ resistive memory cells may not form any current paths between the reference bit line and the reference source line.

In some implementations, the first to $N^{th}$ resistive memory cells may be disposed in a direction of the reference bit line, and the first resistive memory cell and the $N^{th}$ resistive memory cell are arranged at two ends of the reference column.

In some implementations, each of the first to $N^{th}$ resistive memory cells may include: a variable resistance element of which resistance value is changed according to a logic value of data stored therein; and a switch element coupled in series to the variable resistance element.

In some implementations, in the read operation, switch elements of the first resistive memory cell and the $N^{th}$ resistive memory cell may be turned on, and switch elements of the second to $N-1^{th}$ resistive memory cells may be turned off.

In some implementations, the variable resistance element may include at least one of a metal oxide and a phase change substance.

In some implementations, the reference bit line and the reference source line may be formed parallel to each other.

In another aspect, an electronic device is provided to include a semiconductor memory that includes: a plurality of normal columns each including a plurality of resistive memory cells for storing data; a single reference column for generating a reference current in a read operation of the normal columns, the reference column including a plurality of resistive memory cells among which two resistive memory cells disposed at two ends of the reference column store data of different states before performing a read operation; and a data sensing circuit coupled to the normal columns for sensing a data current from a selected normal column and coupled to the reference column for receiving the reference current, the data sensing circuit operable to compare the data current flowing through the selected normal column with the reference current flowing through the reference column to determine a value of data in the read operation.

In some implementations, in the read operation, current may flow through a selected resistive memory cell in the selected normal column, and current may flow through the two resistive memory cells.

In some implementations, the reference column includes: a reference bit line; and a reference source line, wherein, in the read operation, current paths are formed through the two resistive memory cells.

In some implementations, each of the plurality of resistive memory cells includes: a variable resistance element of which resistance value is changed according to a logic value of data stored therein; and a switch element coupled in series to the variable resistance element.

In some implementations, the data sensing circuit may include: a pre-sensing unit configured to generate a first voltage corresponding to the current flowing through the selected normal column; a reference voltage generation unit configured to generate a second voltage corresponding to the current flowing through the reference column; and a comparison unit configured to compare the first voltage and the second voltage and generate data.

In some implementations, the variable resistance element may include at least one of a metal oxide and a phase change substance.

In some implementations, the electronic device may further include a microprocessor which includes: a control unit that is configured to receive a signal including a command from an outside of the microprocessor, and performs extracting, decoding of the command, or controlling input or output of a signal of microprocessor; an operation unit configured to perform an operation based on a result that the control unit decodes the command; and a memory unit configured to store data for performing the operation, data corresponding to a result of performing the operation, or an address of data for which the operation is performed, wherein the semiconductor memory unit that includes the resistance variable element may be part of the memory unit in the microprocessor.

In some implementations, the electronic device may further include a processor which includes: a core unit configured to perform, based on a command inputted from an outside of the processor, an operation corresponding to the command, by using data; a cache memory unit configured to store data for performing the operation, data corresponding to a result of performing the operation, or an address of data for which the operation is performed; and a bus interface connected between the core unit and the cache memory unit, and configured to transmit data between the core unit and the cache memory unit, wherein the semiconductor memory unit that includes the resistance variable element may be part of the cache memory unit in the processor.

In some implementations, the electronic device may further include a processing system which includes: a processor configured to decode a command received by the processor and control an operation for information based on a result of decoding the command; an auxiliary memory device configured to store a program for decoding the command and the information; a main memory device configured to call and store the program and the information from the auxiliary memory device such that the processor can perform the operation using the program and the information when executing the program; and an interface device configured to perform communication between the processor, the auxiliary memory device or the main memory device and the outside, wherein the semiconductor memory unit that includes the resistance variable element may be part of the auxiliary memory device or the main memory device in the processing system.

In some implementations, the electronic device may further include a data storage system which includes: a storage device configured to store data and conserve stored data regardless of power supply; a controller configured to control input and output of data to and from the storage device according to a command inputted form an outside; a temporary storage device configured to temporarily store data exchanged between the storage device and the outside; and an interface configured to perform communication between at least one of the storage device, the controller and the temporary storage device and the outside, wherein the semiconductor memory unit that includes the resistance variable element is part of the storage device or the temporary storage device in the data storage system.

In some implementations, the electronic device may further include a memory system which includes: a memory configured to store data and conserve stored data regardless of power supply; a memory controller configured to control input and output of data to and from the memory according to a command inputted form an outside; a buffer memory configured to buffer data exchanged between the memory and the outside; and an interface configured to perform communication between at least one of the memory, the memory controller and the buffer memory and the outside, wherein the semiconductor memory unit that includes the resistance variable element is part of the memory or the buffer memory in the memory system In another aspect, a method for operating an electronic device is provided. The method may include: providing a normal column including resistive memory cells, each resistive memory cell operable to store data, and a reference column including resistive memory cells for generating a reference current that is used in reading data stored in a memory cell in the normal column; prior to a read operation, storing data of different states in two selected resistive memory cells among resistive memory cells in the reference column, which are arranged at first and last rows of the reference column; during the read operation, forming current paths such that different currents flow through the two selected resistive memory cells to combined into a reference current; and comparing the reference current and a data current from the normal column to determine a data value represented by the data current.

In some implementations, the method may further include: selecting a particular resistive memory cell among resistive memory cells in the normal column to provide a current flowing through the particular memory cell; and comparing the current with a value associated with the reference current to determine data stored in the particular memory cell.

In some implementations, the forming of the current paths may include: turning on the two resistive memory cells; and turning off the remaining resistive memory cells of the reference column.

In some implementations, the reference column may have a total resistance value in the read operation that is obtained from parallel-connected two resistance elements on the respective current paths, the two resistance elements including two resistive memory cells, respectively.

In yet another aspect, an electronic device including a semiconductor memory is provided. The semiconductor memory comprises: a normal column including resistive memory cells and providing a current flowing through a resistive memory cell in the normal column that is selected to store data; a single reference column including resistive memory cells and providing a reference current flowing through the single reference column; and a data sensing circuit comparing the current with a value associated with the reference current to determine data stored in the selected resistive memory cell.

In some implementations, among the resistive memory cells of the single reference column, two resistive memory cells which are arranged at first and last rows of the reference column are turned on during a read operation and the remaining memory cells of the single reference column may be turned off during the read operation.

In some implementations, the two resistive memory cells may have data of different states stored therein prior to the read operation.

Those and other aspects of the disclosed technology and their implementations and variations are described in greater detail in the drawings, the description and the claims.

DETAILED DESCRIPTION

Various examples and implementations of the disclosed technology are described below in detail with reference to the accompanying drawings.

A semiconductor device in accordance with implementations of the present disclosure may include a resistance variable element. In the following descriptions, a resistance variable element may exhibit a resistance variable characteristic and may include a single layer or a multi-layer. For example, a resistance variable element may include substances used in an RRAM, a PRAM, an MRAM, an FRAM, and so forth, for example, a chalcogenide-based compound, a transition metal compound, a ferroelectric, a ferromagnetic, and so forth. However, other implementations are possible so long as a resistance variable element has a resistance variable characteristic switched between different resistance states according to voltages or currents applied to two ends thereof.

In some implementations, a resistance variable element may include a metal oxide. For example, the metal oxide may be a transition metal oxide such as a nickel (Ni) oxide, a titanium (Ti) oxide, a hafnium (Hf) oxide, a zirconium (Zr) oxide, a tungsten (W) oxide and a cobalt (Co) oxide or a perovskite-based substance such as STO (SrTiO) and PCMO (PrCaMnO). Such a variable resistance element may exhibit a characteristic switched between different resistance states due to creation and extinction of current filaments through behavior of vacancies.

In other implementations, a variable resistance element may include a phase change substance. For example, the phase change substance may be a chalcogenide-based substance such as GST (Ge—Sb—Te). This variable resistance element may exhibit a characteristic switched between different resistance states by being stabilized in a crystalline state and an amorphous state by heat.

Further, a variable resistance element may include a structure in which a tunneling barrier layer is interposed between two ferromagnetic layers. The ferromagnetic layers may be formed using a substance such as NiFeCo and CoFe, and the tunneling barrier layer may be formed using a substance such as $Al_2O_3$. The variable resistance element may exhibit a characteristic switched between different resistance states according to magnetization directions of the ferromagnetic layers. For example, in the case where the magnetization directions of the two ferromagnetic layers are parallel to each other, the variable resistance element may be in a low resistance state, and, in the case where the magnetization directions of the two ferromagnetic layers are anti-parallel to each other, the variable resistance element may be in a high resistance state.

Figure 1:
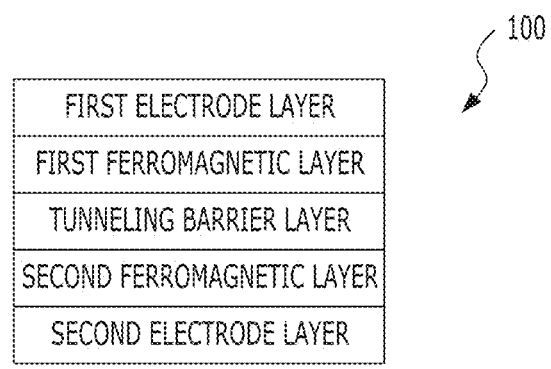
FIG. 1 is a diagram showing an example of a magnetic tunnel junction (MTJ) element including a tunneling barrier layer is interposed between two ferromagnetic layers.

FIG. 1 is a diagram showing an example of a magnetic tunnel junction (MTJ) element as one of structures in which a tunneling barrier layer is interposed between two ferromagnetic layers.

Referring to FIG. 1, an MTJ element 100 includes a first electrode layer as a top electrode, a second electrode layer as a bottom electrode, a first ferromagnetic layer and a second ferromagnetic layer as a pair of ferromagnetic layers, and a tunneling barrier layer which is formed between the pair of ferromagnetic layers.

The first ferromagnetic layer may be a free ferromagnetic layer of which magnetization direction may be changed according to a direction of current applied to the MTJ element 100, and the second ferromagnetic layer may be a pinned ferromagnetic layer of which magnetization direction is pinned.

The MTJ element 100 is changed in its resistance value according to a direction of current, and records data "0" or "1".

Figure 2A:
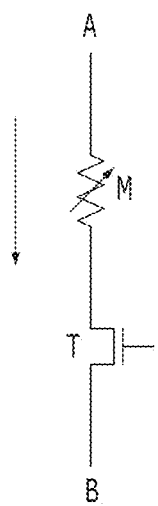
FIGS. 2A and 2B are diagrams explaining a principle of storing data in a resistance variable element.
Figure 2B:
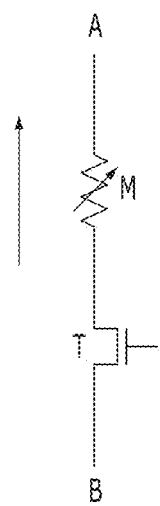

FIGS. 2A and 2B are views explaining a principle of storing data in a variable resistance element M. The variable resistance element M may be the MTJ element 100 described above with reference to FIG. 1.

FIG. 2A is a diagram explaining a principle of recording data with a low logic value in the variable resistance element M. In order to select the variable resistance element M in which data is to be stored, a word line WL coupled to the variable resistance element M is activated, and a transistor T is turned on. As current flows from one end A to the other end B (in the direction indicated by the arrow), that is, from the first electrode layer as a top electrode to the second electrode layer as a bottom electrode in the MTJ element 100 shown in FIG. 1, the magnetization direction of the first ferromagnetic layer as a free ferromagnetic layer and the magnetization direction of the second ferromagnetic layer as a pinned ferromagnetic layer become parallel to each other, and the variable resistance element M is in a low resistance state. When the variable resistance element M is in the low resistance state, it is defined that 'low' data is stored in the variable resistance element M.

FIG. 2B is a diagram explaining a principle of recording data with a high logic value in the variable resistance element M. In a similar manner, the word line WL coupled to the variable resistance element M is activated, and the transistor T is turned on. As current flows from the other end B to one end A (in the direction indicated by the arrow), that is, from the second electrode layer to the first electrode layer in the MTJ element 100 shown in FIG. 1, the magnetization direction of the first ferromagnetic layer and the magnetization direction of the second ferromagnetic layer become anti-parallel to each other, and the variable resistance element M is in a high resistance state. When the variable resistance element M is in the high resistance state, it is defined that 'high' data is stored in the variable resistance element M.

Figure 3:
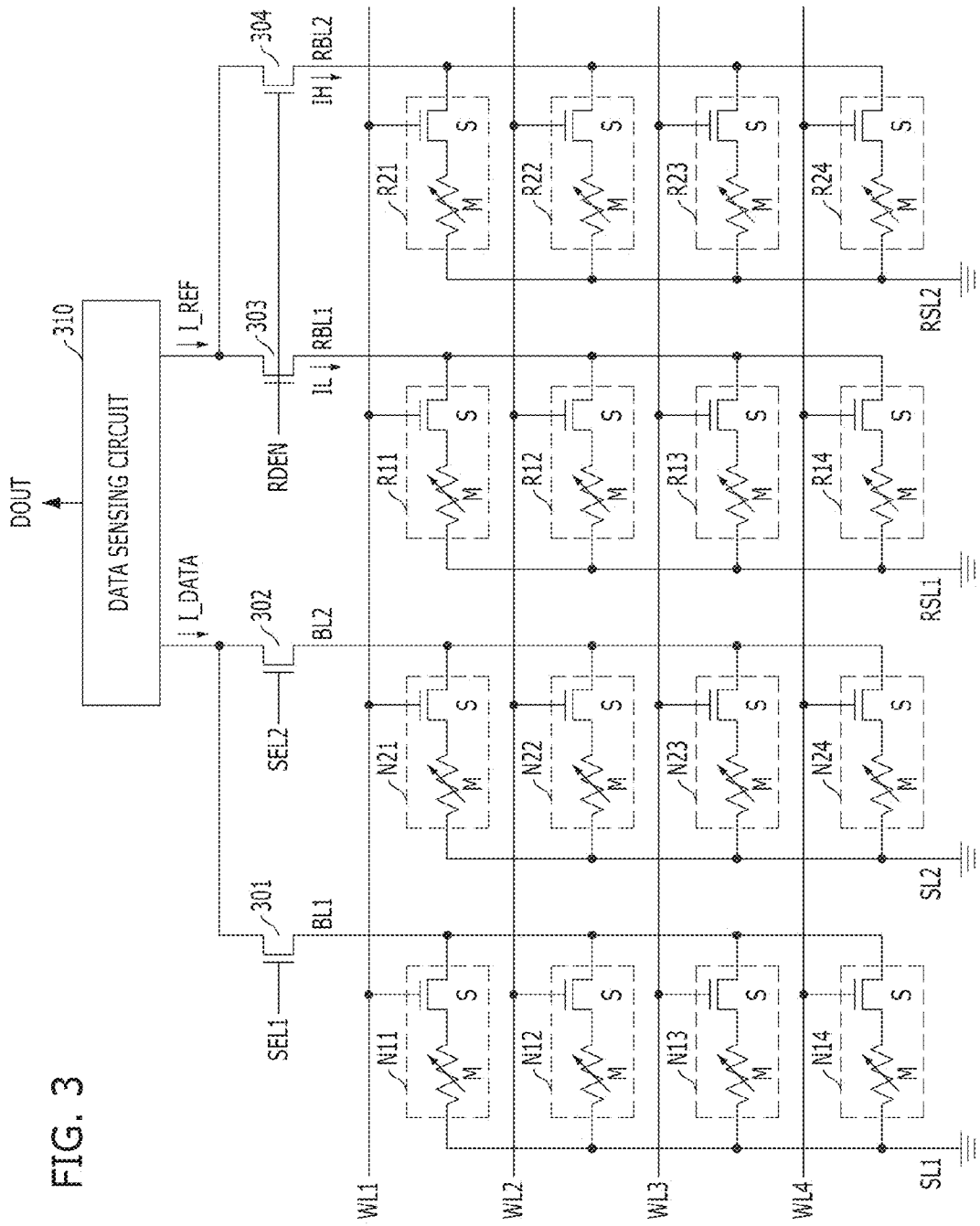
FIG. 3 is a diagram showing a cell array including resistance variable elements which is associated with a read operation.

FIG. 3 is a diagram showing a cell array including variable resistance elements M and a circuit configuration associated with a read operation of the cell array.

Referring to FIG. 3, in a cell array, source lines SL1, SL2, RSL1 and RSL2 and bit lines BL1, BL2, RBL1 and RBL2 are disposed in parallel, and word lines WL1 to WL4 are disposed perpendicularly to the source lines SL1, SL2, RSL1 and RSL2 and the bit lines BL1, BL2, RBL1 and RBL2. A pair of one source line and one bit line (for example, the source line SL1 and the bit line BL1) form a column, and each word line forms a row. Resistive memory cells N11 to N24 and R11 to R24 are formed by respective rows and respective columns. Each of the resistive memory cells N11 to N24 and R11 to R24 includes a variable resistance element M of which resistance value is changed according to the logic value of the data stored therein and a switch element S which is coupled in series to the variable resistance element M.

The resistive memory cells N11 to N24 are used to store data, and the resistive memory cells R11 to R24 are used to generate reference current I_REF for reading data of the resistive memory cells N11 to N24. Since the columns defined by the source lines SL1 and SL2 and the bit lines BL1 and BL2 are used to store data, they are referred to as normal columns, and since the columns defined by the source lines RSL1 and RSL2 and the bit lines RBL1 and RBL2 are used to generate the reference current I_REF, they are referred to as reference columns. Before performing the read operation, low data are stored in all of the resistive memory cells R11 to R14 of a first reference column defined by the source line RSL1 and the bit line RBL1. Accordingly, the variable resistance elements M of the resistive memory cells R11 to R14 have a low resistance value (RL). Also, before performing a read operation, high data are stored in all of the resistive memory cells R21 to R24 of a second reference column defined by the source line RSL2 and the bit line RBL2. Accordingly, the variable resistance elements M of the resistive memory cells R21 to R24 have a high resistance value (RH). Data can be stored in the resistive memory cells R11 to R24 before the read operation. For example, data may be stored in the resistive memory cells R11 to R24 when fabricating a semiconductor device or initializing the semiconductor device.

In performing the read operation, a read enable signal RDEN is activated to a high level, and switches 303 and 304 are turned on. One of select signals SEL1 and SEL2 coupled to a normal column which is selected to perform the read operation is activated to a high level, and the other select signal is deactivated to a low level. Accordingly, one of switches 301 and 302 that is coupled to the selected normal column is turned on. Further, a word line corresponding to a selected row is activated to a high level among the word lines WL1 to WL4, and the remaining word lines are deactivated to a low level.

Hereinbelow, the read operation will be described on the assumption that the resistive memory cell N12 defined by the first normal column and the second row is selected. Since the select signal SEL1 is activated to the high level, the switch 301 is turned on. Thus, a current path is formed between the bit line BL1 and a data sensing circuit 310. Since the word line WL2 is activated to the high level, the switch element S of the resistive memory cell N12 is turned on, and a current path is formed through the resistive memory cell N12 between the bit line BL1 and the source line SL1. Under this condition, a current path is formed through the variable resistance element M of the resistive memory cell N12 between a ground terminal and the data sensing circuit 310. In the case where high data is stored in the variable resistance element M of the resistive memory cell N12, the resistive memory cell N12 has a high resistance state with the high resistance value (RH) and thus, the value of current I_DATA becomes relatively small. In the case where low data is stored in the variable resistance element M of the resistive memory cell N12, the resistive memory cell N12 has a low resistance state with the low resistance value (RL) and thus the value of the current I_DATA becomes relatively large.

Since the switch element S of the resistive memory cell R12 of the first reference column is turned on, the current IL of which value is determined by the resistive memory cell R12 flows through the bit line RBL1. Since low data is stored in the resistive memory cell R12, the amount of the current IL flowing through the bit line RBL1 is relatively large. Moreover, since the switch element S of the resistive memory cell R22 of the second reference column is turned on, current IH of which value is determined by the resistive memory cell R22 flows through the bit line RBL2. Since high data is stored in the resistive memory cell R22, the amount of the current IH flowing through the bit line RBL2 is relatively small. The reference current I_REF determined by summing the current IL and the current IH flows from the data sensing circuit 310 to ground terminals. By dividing the reference current I_REF by two, the middle value of the sum of the current IH and the current IL is obtained.

The data sensing circuit 310 senses data using the current I_DATA and the reference current I_REF. In one embodiment, when I_DATA is greater than I_REF/2 which is obtained by dividing the sum of IL and IH by two, i.e., (IL+IH)/2, the data of the selected memory cell N12 is recognized as low, and when I_DATA is smaller than I_REF/2 which is obtained by dividing the sume of IL and IH by two, i.e., (IL+IH)/2, the data of the selected memory cell N12 is recognized as high.

In the semiconductor of FIG. 3, only one cell can be accessed in one column due to the structure of the cell array. Further, since the current IL corresponding to a memory cell which stores low data and the current IH corresponding to a memory cell which stores high data are necessary to generate the reference current I_REF, two columns are used to generate the reference current I_REF. Thus, memory cells used for generating the reference current I_REF occupy a substantially large portion in the area of the cell array. Nevertheless, it is difficult to dispose memory cells for generating the reference current I_REF outside the cell array. The reason for this resides in that, because substantial parasitic resistance is present in the source line SL and the bit line BL, it is impossible or rather difficult to generate the reference current I_REF with a precise level.

Figure 4:
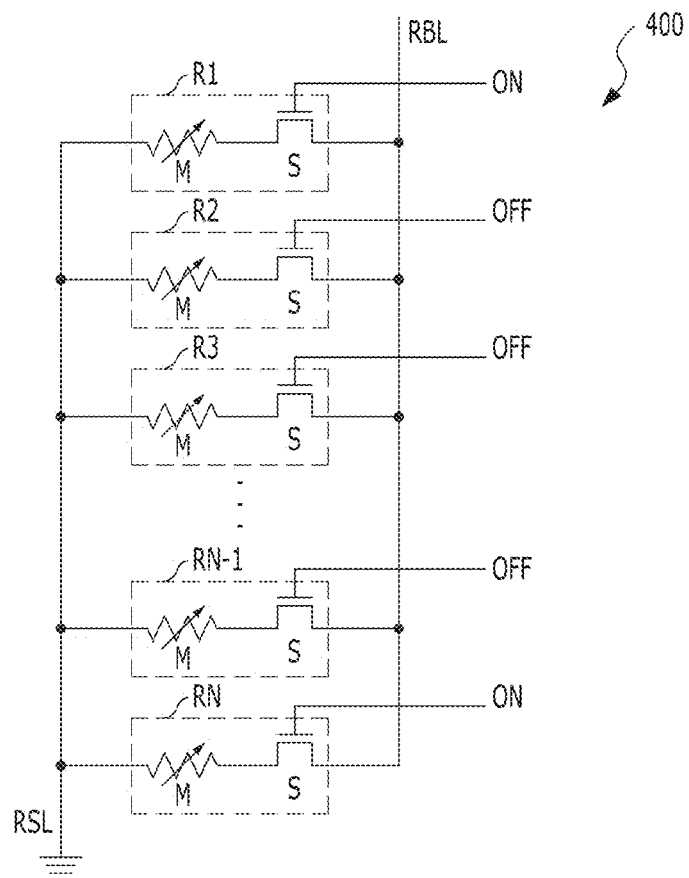
FIG. 4 is a configuration diagram of a reference column of a semiconductor device.

In recognition of the above technical issues in the circuit in FIG. 3, the examples of memory circuits or devices of FIGS. 4 to 7 are provided to generate the precise reference current I_REF while reducing the area of memory cells for generating reference current I_REF.variable resistance element FIG. 4 is a configuration diagram of a reference column 400 of a memory circuit or device.

Referring to FIG. 4, the reference column 400 includes a reference bit line RBL, a reference source line RSL, and first to $N^{th}$ resistive memory cells R1 to RN. Each of the resistive memory cells R1 to RN includes a variable resistance element M of which resistance value is changed according to the data stored therein and a switch element S which is coupled in series to the variable resistance element M.

Current paths are formed through the first resistive memory cell R1 and the $N^{th}$ resistive memory cell RN among the first to $N^{th}$ resistive memory cells R1 to RN which are included in the reference column 400, and current paths are not formed through the remaining resistive memory cells R2 to RN-1. In other words, in a read operation, the switch elements S of the first resistive memory cell R1 and the $N^{th}$ resistive memory cell RN are turned on, whereas the switch elements S of the remaining resistive memory cells R2 to RN-1 are turned off. The symbol ON in FIG. 4 shows that a corresponding switch S is turned on in the read operation of the memory circuit, and the symbol OFF in FIG. 4 shows that a corresponding switch S is turned off in the read operation of the memory circuit.

Before performing the read operation, low data is stored in the first resistive memory cell R1. Accordingly, the first resistive memory cell R1 has a low resistance value (RL). Also, before performing the read operation, high data is stored in the $N^{th}$ resistive memory cell RN. Accordingly, the $N^{th}$ resistive memory cell RN has a high resistance value (RH). Data can be stored in the resistive memory cells R1 and RN before the read operation. In this regard, data may be recorded in the resistive memory cells R1 and RN in the fabrication of a memory circuit or in the initialization of a memory circuit. While it is exemplified herein that low data is stored in the first resistive memory cell R1 and high data is stored in the $N^{th}$ resistive memory cell RN, it may be envisaged that high data is stored in the first resistive memory cell R1 and low data is stored in the $N^{th}$ resistive memory cell RN. Namely, data with opposite logics can be stored in the first resistive memory cell R1 and the $N^{th}$ resistive memory cell RN.

Any data may be stored in the second to $N-1^{th}$ resistive memory cells R2 to RN-1. The second to $N-1^{th}$ resistive memory cells R2 to RN-1 do not form current paths in the read operation. That is to say, because the second to $N-1^{th}$ resistive memory cells R2 to RN-1 are not involved in generating reference current I_REF in the read operation, any data may be or may not be recorded in the second to $N-1^{th}$ resistive memory cells R2 to RN-1.

As described above, different data are stored in the resistive memory cells R1 and RN which are disposed at two ends of the reference column 400 and connected to the reference source line RSL and the reference bit line RBL, and current paths are formed in the resistive memory cells R1 and RN in the read operation. Although it may be envisaged that different data are stored in two resistive memory cells among the resistive memory cells R2 to RN-1 other than the resistive memory cells R1 and RN disposed at two ends of the reference column 400 in such a manner that current paths are formed in the resistive memory cells in which the different data are stored, the value of generated reference current I_REF may become inaccurate in this case. The reason to this will be described below.

Figure 5A:
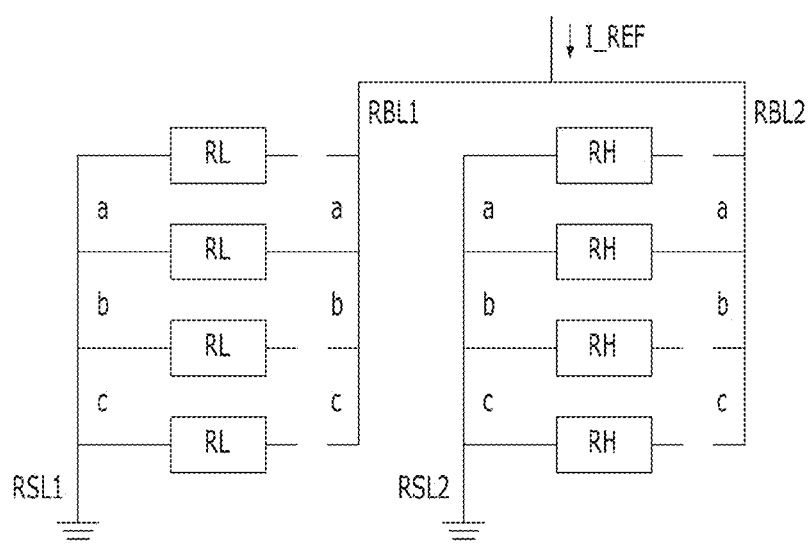
FIG. 5A is a diagram showing current paths which are formed through the reference columns of FIG. 3.
Figure 5B:
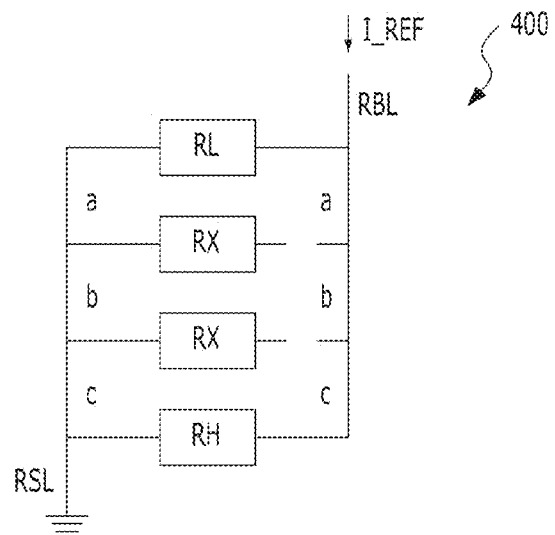
FIG. 5B is a diagram showing current paths which are formed through the reference column of FIG. 4.

FIG. 5A is a diagram showing current paths which are formed through the reference columns (the columns corresponding to the lines RBL1, RSL1, RBL2 and RSL2) of FIG. 3, and FIG. 5B is a diagram showing current paths which are formed through the reference column 400 of FIG. 4.

FIG. 5A shows current paths which are formed in the reference columns (the columns corresponding to the lines RBL1, RSL1, RBL2 and RSL2) of FIG. 3. It is assumed that the second word line WL2 is activated in FIG. 3. and the values a, b and c denote the resistance values of the corresponding sections of the bit lines RBL1 and RBL2 and the source lines RSL1 and RSL2. In this case, the resistance value on the current path on the first bit line RBL1 and the first source line RSL1 amounts to (a+RL+b+c) and the resistance value on the current path on the second bit line RBL2 and the second source line RSL2 amounts to (a+RH+b+c). Since value on the current paths which are formed through the two reference columns in parallel is defined by the lines RBL1, RSL1, RBL2 and RSL2 and is represented as (a+RL+b+c)//

(a+RH+b+c). Even when one of other word lines WL1, WL3 and WL4 is activated instead of the second word line WL2, an effective resistance value of the parallel current paths through which the reference current I_REF flows is the same as (a+RL+b+c)//(a+RH+b+c).

FIG. 5B shows current paths which are formed in the reference column 400 of FIG. 4. The values a, b and c denote the resistance values of the corresponding sections of the bit line RBL and the source line RSL. Referring to FIG. 5B, two current paths are formed from the top end of the bit line RBL to the bottom end of the source line RSL, which have resistance values (RL+a+b+c) and (a+b+c+RH), respectively. Accordingly, an effective resistance value on the current paths through which the reference current I_REF flows is obtained as (RL+a+b+c)//(a+b+c+RH). This value [(RL+a+b+c)//(a+b+c+RH)] is the same as the effective resistance value [(a+RL+b+c)//(a+RH+b+c)] as obtained in FIG. 5A. In other words, it is possible to generate the same reference current I_REF by using one reference column 400 as in the case of using the two reference columns in FIGS. 3 and 5A. In FIG. 5B, memory cells which are not used in generating the reference current I_REF are designated by the symbol RX. The memory cells as indicated with the symbol RX may have any resistance values.

Figure 5C:
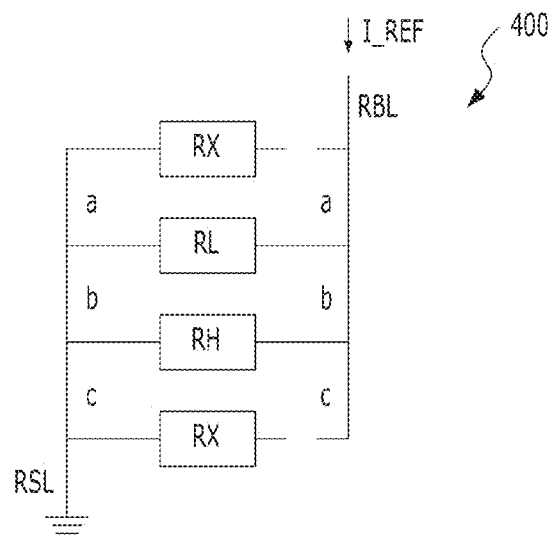
FIG. 5C is a diagram showing current paths which are formed through the reference column of FIG. 4.

FIG. 5C is a diagram showing current paths in the case where the reference current I_REF is generated using different memory cells from those in FIG. 4. Referring to FIG. 5C, the current path forms a combined series and parallel resistances. First, the current path divides into divided current paths after the corresponding section having a resistance value "a" on the line RBL. The divided current paths have resistance values (RL+b) and (b+RH), respectively, and combine into a common path before the corresponding section having a resistance value c on the line RSL. Accordingly, in FIG. 5C, an effective resistance value becomes a+{(RL+b)//(b+RH)}+c. This value [a+{(RL+b)//(b+RH)}+c] is different from the effective resistance value [(a+RL+b+c)//(a+RH+b+c)] obtained in FIGS. 5A and 5B. For this reason, it is difficult to generate the precise reference current I_REF using the reference column as shown in FIG. 5C. Therefore, it is advantageous to generate the reference current I_REF using the resistive memory cells disposed at two ends in the reference column 400 of FIG. 4.

Figure 6:
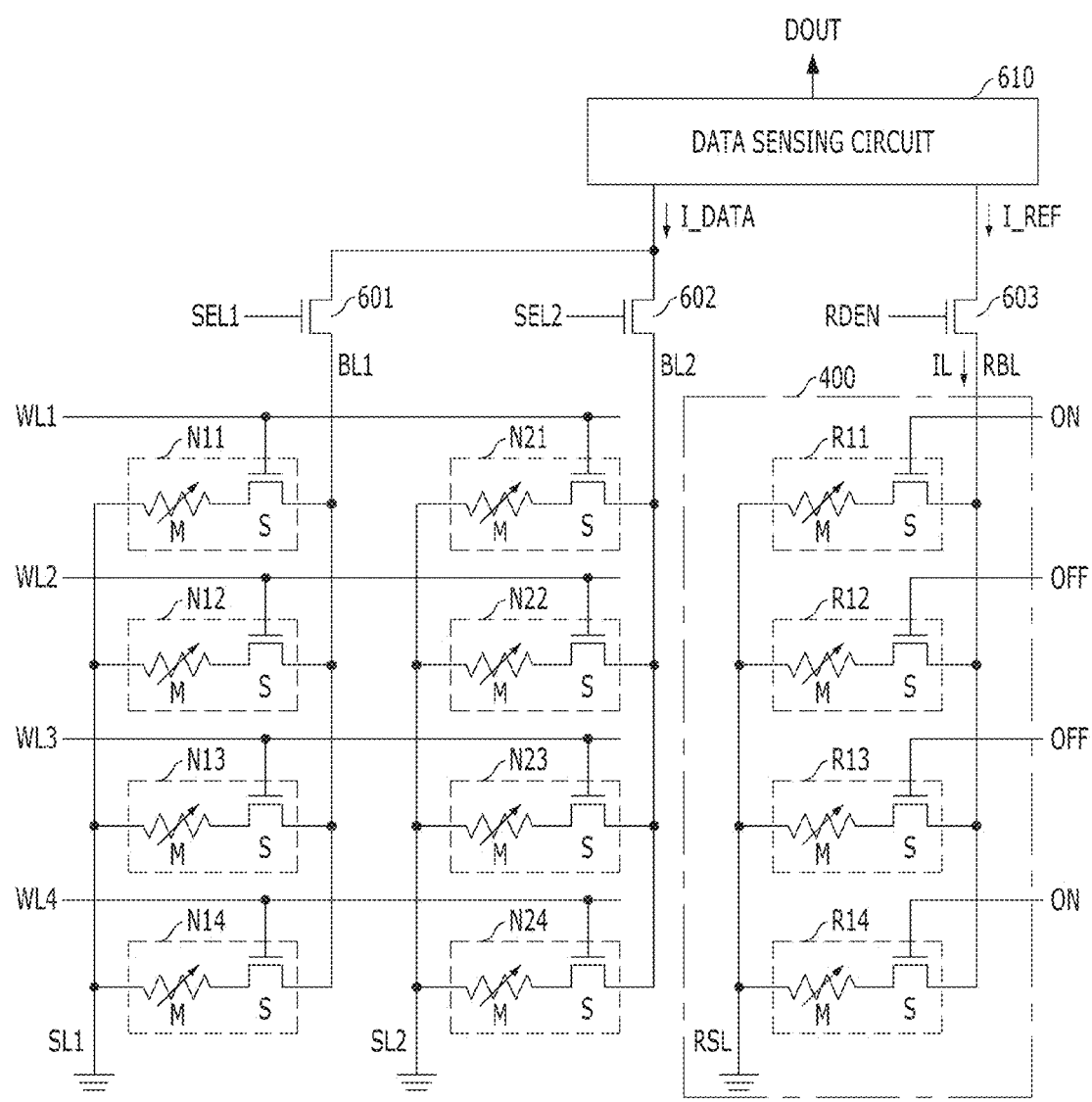
FIG. 6 is a configuration diagram of an exemplary implementation of a semiconductor device to which the reference column of FIG. 4 is applied.

FIG. 6 is a configuration diagram of an exemplary implementation of a memory circuit or device to which the reference column 400 of FIG. 4 is applied.

Referring to FIG. 6, in a cell array, source lines SL1, SL2 and RSL and bit lines BL1, BL2 and RBL are disposed in parallel, and word lines WL1 to WL4 are disposed perpendicularly to the source lines SL1, SL2 and RSL and the bit lines BL1, BL2 and RBL. A pair of one source line and one bit line (for example, the source line SL1 and the bit line BL1) form a column, and each word line forms a row. Resistive memory cells N11 to N24 and R11 to R14 are formed by respective rows and respective columns. Each of the resistive memory cells N11 to N24 and R11 to R14 includes a variable resistance element M of which resistance value is changed according to the logic value of the data stored therein and a switch element S which is coupled in series to the variable resistance element M.

The resistive memory cells N11 to N24 are used to store data, and the resistive memory cells R11 to R14 of a reference column 400 are used to generate reference current I_REF for reading data stored in the resistive memory cells N11 to N24. The columns defined by the source lines SL1 and SL2 and the bit lines BL1 and BL2 are used to store data and thus are referred to as normal columns; and the column 400 defined by the source line RSL and the bit line RBL is used to generate the reference current I_REF and thus is referred to as a reference column. In a read operation, among the resistive memory cells R11 to R14 of the reference column 400, the switch elements S of the memory cells R11 and R14 disposed at two ends of the reference column 400 are turned on, and the switch elements S of the remaining resistive memory cells R12 and R13 are turned off. Accordingly, current paths are formed through the resistive memory cells R11 and R14 in the reference column 400. Before performing the read operation, high data is stored in one of the resistive memory cells R11 and R14, and low data is stored in the other of the resistive memory cells R11 and R14.

In performing the read operation, a read enable signal RDEN is activated to a high level, and a switch 603 is turned on. One of select signals SEL1 and SEL2 coupled to a normal column which is selected to perform the read operation is activated to a high level, and the other select signal coupled to a normal column which is not selected is deactivated to a low level. Accordingly, one of switches 601 and 602 corresponding to the selected normal column is turned on. Further, among the word lines WL1 to WL4, a word line corresponding to a selected row is activated to a high level, and the remaining word lines are deactivated to a low level.

Hereinbelow, the read operation will be described on the assumption that the resistive memory cell N12 defined by the first normal column and the second row is selected. Since the select signal SEL1 is activated to the high level, the switch 601 is turned on. Also, since the word line WL2 is activated to the high level, the switch element S of the resistive memory cell N12 is turned on, and a current path is formed through the resistive memory cell N12 between the bit line BL1 and the source line SL1. That is to say, a current path is formed through the variable resistance element M of the resistive memory cell N12 between a ground terminal and a data sensing circuit 610. In the case where high data is stored in the variable resistance element M of the resistive memory cell N12, the resistive memory cell N12 has a high resistance state (with a high resistance value (RH)) and thus the value of current I_DATA becomes relatively small, and in the case where low data is stored in the variable resistance element M of the resistive memory cell N12, the resistive memory cell N12 has a low resistance state (with a low resistance value (RL)) and thus the value of the current I_DATA becomes relatively large.

In the reference column 400, current paths are formed through the resistive memory cell R11 having a low resistance state (with a low resistance value (RL)) and the resistive memory cell R14 having a high resistance state (with a high resistance value (RH)), and the reference current I_REF is generated by the resistive memory cells R11 and R14. The value of the reference current I_REF generated through the reference column 400 is obtained as the sum of IL and IH, which is the same as the value of the reference current I_REF in FIG. 3. By dividing the reference current I_REF by two, the middle value of the sum of the current IH and the current IL is obtained.

The data sensing circuit 610 senses data using the current I_DATA and the reference current I_REF. In one embodiment, when I_DATA is greater than 1 REF/2 which is obtained by dividing the sum of IL and IH by two, i.e., (IL+IH)/2, the data of the selected memory cell N12 is recognized as low, and when I_DATA is smaller than 1 REF/2 which is obtained by dividing the sum of IL and IH by two, i.e., (IL+IH)/2, the data of the selected memory cell N12 is recognized as high.

While it is shown in FIG. 6 that the resistive memory cells N11 to N24 for storing data are disposed at (2 columns)×(4 rows), the numbers of columns and rows may vary from several tens to several hundreds. The number of rows (that is, the number of resistive memory cells) included in the reference column 400 is determined to be the same as the number of normal rows. For example, when a cell array is configured by (100 columns)×(50 rows), the reference column 400 is configured by 50 rows, and the reference current I_REF is generated by the resistive memory cell of the first row and the resistive memory cell of the fiftieth row in the reference column 400.

Figure 7:
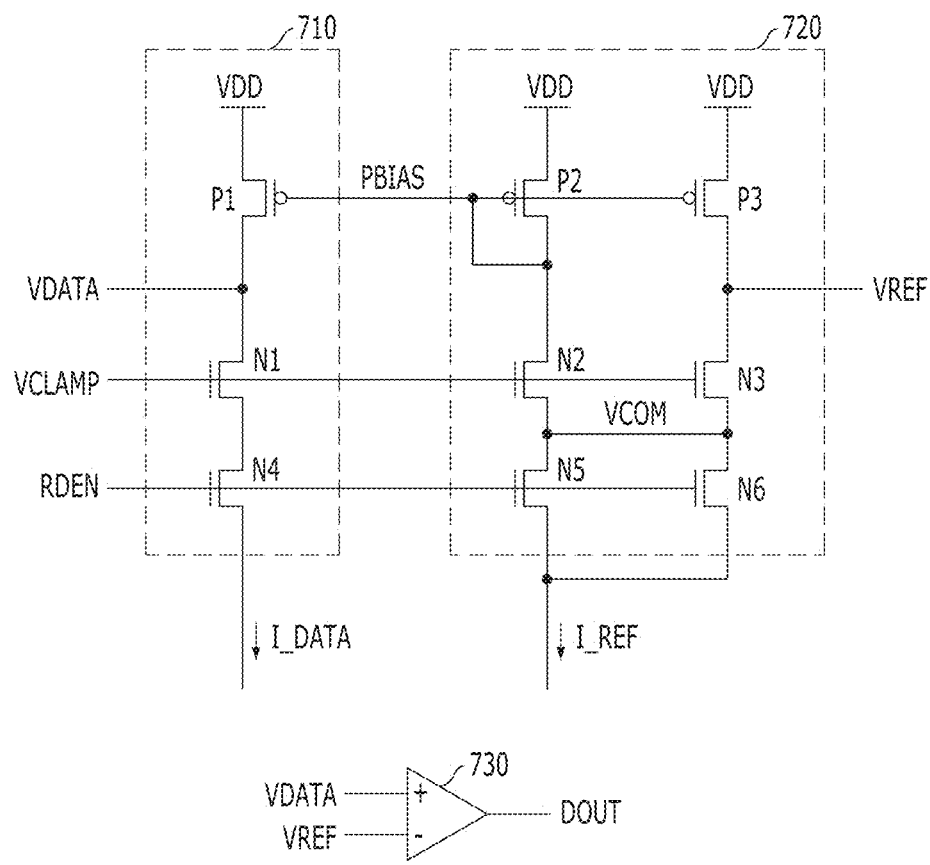
FIG. 7 is a configuration diagram of an exemplary implementation of the data sensing circuit of FIG. 6.

FIG. 7 is a configuration diagram of an exemplary implementation of the data sensing circuit 610 of FIG. 6.

Referring to FIG. 7, the data sensing circuit 610 includes a pre-sensing unit 710 configured to generate a first voltage VDATA corresponding to the current I_DATA flowing through a selected normal column, a reference voltage generation unit 720 configured to generate a second voltage VREF corresponding to the reference current I_REF flowing through the reference column 400, and a comparison unit 730 configured to compare the first voltage VDATA and the second voltage VREF and generate data DOUT.

A transistor P2 of the reference voltage generation unit 720 is diode-coupled, and transistors N2 and N3 have gate terminals to which a clamp voltage VCLAMP is applied and source terminals which share a common voltage VCOM. The reason why a source voltage is clamped as the clamp voltage VCLAMP is to prevent excessive current from flowing and the data stored in a memory cell from being changed while the read operation is performed. Transistors N5 and N6 are controlled by the read enable signal RDEN which is activated to perform the read operation, and are turned on in the read operation. Since the source terminals of the transistors N2 and N3 are shared, current I_REF/2 corresponding to one half of the reference current I_REF flows through the respective transistors N2 and N3. Namely, current I_REF/2 flows through the transistor N2 and the transistor P2, and current I_REF/2 also flows through the transistor N3 and a transistor P3. The second voltage VREF is generated by the current I_REF/2 flowing through the transistors.

Since a transistor P1 of the pre-sensing unit 710 is biased by the same voltage PBIAS as the transistors P2 and P3, current I_REF/2 flows through the transistor P1 as well. In this situation, if the current I_DATA flowing through the normal column is smaller than the current flowing through the transistor P1, the level of the first voltage VDATA rises, and if the current I_DATA flowing through the normal column is larger than the current flowing through the transistor P1, the level of the first voltage VDATA falls.

The comparison unit 730 compares the first voltage VDATA and the second voltage VREF, and outputs the output data DOUT to a high level when the first voltage VDATA is higher than the second voltage VREF and to a low level when the second voltage VREF is higher than the first voltage VDATA.

As a result, the data sensing circuit 610 senses data as low when the value of the data current I_DATA is larger than one half I_REF/2 of the value of the reference current I_REF, and senses data as high when the value of the data current I_DATA is smaller than one half I_REF/2 of the value of the reference current I_REF.

FIG. 7 shows an example of the data sensing circuit 610 and it is to be noted that various modifications may be made to the data sensing circuit 610 which senses data using the data current I_DATA generated through the normal column and the reference current I_REF generated through the reference column 400.

According to the above-described implementations, it is possible to generate precise reference current using only one reference column.

The above and other memory circuits or semiconductor devices based on the disclosed technology can be used in a range of devices or systems. FIGS. 8 to 12 provide some examples of devices or systems that can implement the memory circuits disclosed herein.

Figure 8:
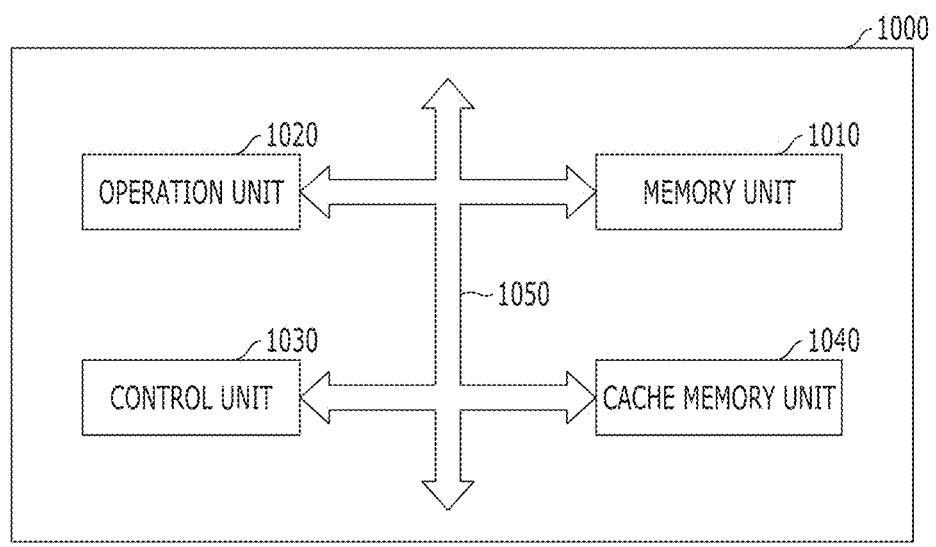
FIG. 8 shows an example of a configuration diagram of a microprocessor implementing memory circuitry based on the disclosed technology.

FIG. 8 shows an example of a configuration diagram of a microprocessor based on another implementation of the disclosed technology.

Referring to FIG. 8, a microprocessor 1000 may perform tasks for controlling and tuning a series of processes of receiving data from various external devices, processing the data, and outputting processing results to external devices. The microprocessor 1000 may include a memory unit 1010, an operation unit 1020, a control unit 1030, and so on. The microprocessor 1000 may be various data processing units such as a central processing unit (CPU), a graphic processing unit (GPU), a digital signal processor (DSP) and an application processor (AP).

The memory unit 1010 is a part which stores data in the microprocessor 1000, as a processor register, register or the like. The memory unit 1010 may include a data register, an address register, a floating point register and so on. Besides, the memory unit 1010 may include various registers. The memory unit 1010 may perform the function of temporarily storing data for which operations are to be performed by the operation unit 1020, result data of performing the operations and an address where data for performing of the operations are stored.

The memory unit 1010 may include one or more of the above-described memory circuits in accordance with the implementations. For example, the memory unit 1010 implementation may include a plurality of normal columns each including a plurality of resistive memory cells, a reference column including a plurality of resistive memory cells in which, before performing a read operation, data of a first state is stored in one of resistive memory cells disposed at two ends of the reference column and data of a second state is stored in the other resistive memory cell, and a data sensing circuit configured to sense data using current flowing through a normal column selected among the plurality of normal columns and current flowing through the reference column, in the read operation. Since it is possible to generate precise reference current using only one reference column, the area of a circuit may be reduced. Through this, the area of the memory unit 1010 may be reduced. Since the memory unit 1010 according to the present implementation may be reduced in area, the microprocessor 1000 may be reduced in area and may be improved in performance.

The operation unit 1020 may perform four arithmetical operations or logical operations according to results that the control unit 1030 decodes commands. The operation unit 1020 may include at least one arithmetic logic unit (ALU) and so on.

The control unit 1030 may receive signals from the memory unit 1010, the operation unit 1020 and an external device of the microprocessor 1000, perform extraction, decoding of commands and controlling input and output of signals of the microprocessor, and execute processing represented by programs.

The microprocessor 1000 according to the present implementation may additionally include a cache memory unit 1040 which can temporarily store data to be inputted from an external device other than the memory unit 1010 or to be outputted to an external device. In this case, the cache memory unit 1040 may exchange data with the memory unit 1010, the operation unit 1020 and the control unit 1030 through a bus interface 1050.

Figure 9:
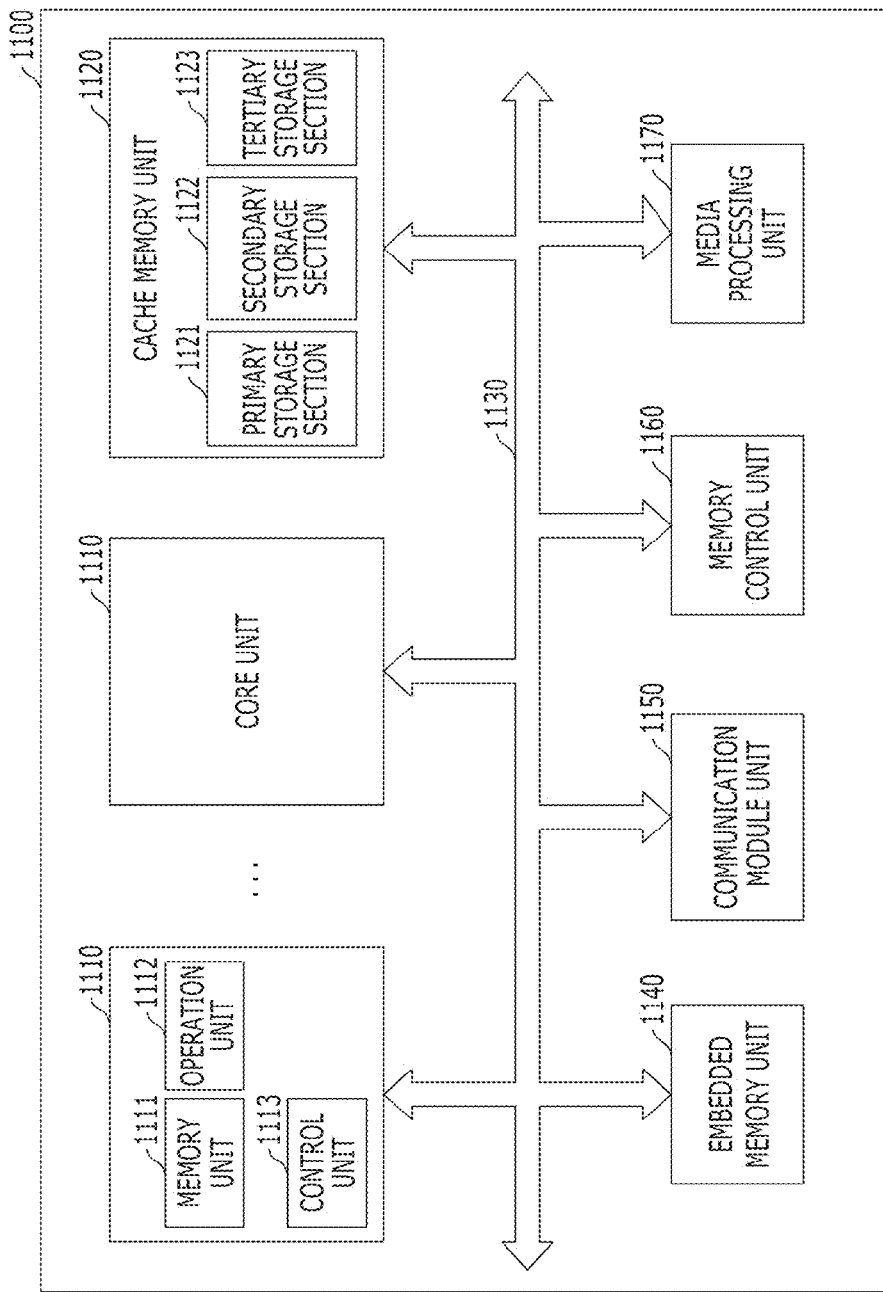
FIG. 9 shows an example of a configuration diagram of a processor implementing memory circuitry based on the disclosed technology.

FIG. 9 is a configuration diagram of a processor based on another implementation of the disclosed technology.

Referring to FIG. 9, a processor 1100 may improve performance and realize multi-functionality by including various functions other than those of a microprocessor which performs tasks for controlling and tuning a series of processes of receiving data from various external devices, processing the data, and outputting processing results to external devices. The processor 1100 may include a core unit 1110 which serves as the microprocessor, a cache memory unit 1120 which serves to storing data temporarily, and a bus interface 1130 for transferring data between internal and external devices. The processor 1100 may include various system-on-chips (SoCs) such as a multi-core processor, a graphic processing unit (GPU) and an application processor (AP).

The core unit 1110 of the present implementation is a part which performs arithmetic logic operations for data inputted from an external device, and may include a memory unit 1111, an operation unit 1112 and a control unit 1113.

The memory unit 1111 is a part which stores data in the processor 1100, as a processor register, a register or the like. The memory unit 1111 may include a data register, an address register, a floating point register and so on. Besides, the memory unit 1111 may include various registers. The memory unit 1111 may perform the function of temporarily storing data for which operations are to be performed by the operation unit 1112, result data of performing the operations and an address where data for performing of the operations are stored. The operation unit 1112 is a part which performs operations in the processor 1100. The operation unit 1112 may perform four arithmetical operations, logical operations, according to results that the control unit 1113 decodes commands, or the like. The operation unit 1112 may include at least one arithmetic logic unit (ALU) and so on. The control unit 1113 may receive signals from the memory unit 1111, the operation unit 1112 and an external device of the processor 1100, perform extraction, decoding of commands, controlling input and output of signals of processor, and execute processing represented by programs.

The cache memory unit 1120 is a part which temporarily stores data to compensate for a difference in data processing speed between the core unit 1110 operating at a high speed and an external device operating at a low speed. The cache memory unit 1120 may include a primary storage unit 1121, a secondary storage unit 1122 and a tertiary storage unit 1123. In general, the cache memory unit 1120 includes the primary and secondary storage units 1121 and 1122, and may include the tertiary storage unit 1123 in the case where high storage capacity is required. As the occasion demands, the cache memory unit 1120 may include an increased number of storage units. That is to say, the number of storage units which are included in the cache memory unit 1120 may be changed according to a design. The speeds at which the primary, secondary and tertiary storage units 1121, 1122 and 1123 store and discriminate data may be the same or different. In the case where the speeds of the respective storage units 1121, 1122 and 1123 are different, the speed of the primary storage unit 1121 may be largest. At least one storage unit of the primary storage unit 1121, the secondary storage unit 1122 and the tertiary storage unit 1123 of the cache memory unit 1120 may include one or more of the above-described memory circuits in accordance with the implementations. For example, the cache memory unit 1120 implementation may include a plurality of normal columns each including a plurality of resistive memory cells, a reference column including a plurality of resistive memory cells in which, before performing a read operation, data of a first state is stored in one of resistive memory cells disposed at two ends of the reference column and data of a second state is stored in the other resistive memory cell, and a data sensing circuit configured to sense data using current flowing through a normal column selected among the plurality of normal columns and current flowing through the reference column, in the read operation. Since it is possible to generate precise reference current using only one reference column, the area of a circuit may be reduced. Through this, the area of the cache memory unit 1120 may be reduced. Since the cache memory unit 1120 according to the present implementation may be reduced in area, the core unit 1110 may be reduced in area.

Although it was shown in FIG. 9 that all the primary, secondary and tertiary storage units 1121, 1122 and 1123 are configured inside the cache memory unit 1120, it is to be noted that all the primary, secondary and tertiary storage units 1121, 1122 and 1123 of the cache memory unit 1120 may be configured outside the core unit 1110 and may compensate for a difference in data processing speed between the core unit 1110 and the external device. Meanwhile, it is to be noted that the primary storage unit 1121 of the cache memory unit 1120 may be disposed inside the core unit 1110 and the secondary storage unit 1122 and the tertiary storage unit 1123 may be configured outside the core unit 1110 to strengthen the function of compensating for a difference in data processing speed. In another implementation, the primary and secondary storage units 1121, 1122 may be disposed inside the core units 1110 and tertiary storage units 1123 may be disposed outside core units 1110. The bus interface 1130 is a part which connects the core unit 1110, the cache memory unit 1120 and external device and allows data to be efficiently transmitted.

The processor 1100 according to the present implementation may include a plurality of core units 1110, and the plurality of core units 1110 may share the cache memory unit 1120. The plurality of core units 1110 and the cache memory unit 1120 may be directly connected or be connected through the bus interface 1130. The plurality of core units 1110 may be configured in the same way as the above-described configuration of the core unit 1110. In the case where the processor 1100 includes the plurality of core unit 1110, the primary storage unit 1121 of the cache memory unit 1120 may be configured in each core unit 1110 in correspondence to the number of the plurality of core units 1110, and the secondary storage unit 1122 and the tertiary storage unit 1123 may be configured outside the plurality of core units 1110 in such a way as to be shared through the bus interface 1130. The processing speed of the primary storage unit 1121 may be larger than the processing speeds of the secondary and tertiary storage unit 1122 and 1123. In another implementation, the primary storage unit 1121 and the secondary storage unit 1122 may be configured in each core unit 1110 in correspondence to the number of the plurality of core units 1110, and the tertiary storage unit 1123 may be configured outside the plurality of core units 1110 in such a way as to be shared through the bus interface 1130. The processor 1100 according to the present implementation may further include an embedded memory unit 1140 which stores data, a communication module unit 1150 which can transmit and receive data to and from an external device in a wired or wireless manner, a memory control unit 1160 which drives an external memory device, and a media processing unit 1170 which processes the data prepared in the processor 1100 or the data inputted from an external input device and outputs the processed data to an external interface device and so on. Besides, the processor 1100 may include a plurality of various modules and devices. In this case, the plurality of modules which are added may exchange data with the core units 1110 and the cache memory unit 1120 and with one another, through the bus interface 1130.

The embedded memory unit 1140 may include not only a volatile memory but also a nonvolatile memory. The volatile memory may include a DRAM (dynamic random access memory), a mobile DRAM, an SRAM (static random access memory) and a memory with similar functions to above mentioned memories, and so on. The nonvolatile memory may include a ROM (read only memory), a NOR flash memory, a NAND flash memory, a phase change random access memory (PRAM), a resistive random access memory (RRAM), a spin transfer torque random access memory (STTRAM), a magnetic random access memory (MRAM), and a memory with similar functions.

The communication module unit 1150 may include a module capable of being connected with a wired network, a module capable of being connected with a wireless network and both of them. The wired network module may include a local area network (LAN), a universal serial bus (USB), an Ethernet, power line communication (PLC) such as various devices which send and receive data through transmit lines, and so on. The wireless network module may include Infrared Data Association (IrDA), code division multiple access (CDMA), time division multiple access (TDMA), frequency division multiple access (FDMA), a wireless LAN, Zigbee, a ubiquitous sensor network (USN), Bluetooth, radio frequency identification (RFID), long term evolution (LTE), near field communication (NFC), a wireless broadband Internet (Wibro), high speed downlink packet access (HSDPA), wideband CDMA (WCDMA), ultra wideband (UWB), such as various devices which send and receive data without transmit lines, and so on.

The memory control unit 1160 is to administrate and process data transmitted between the processor 1100 and an external storage device operating according to a different communication standard. The memory control unit 1160 may include various memory controllers, for example, devices which may control IDE (Integrated Device Electronics), SATA (Serial Advanced Technology Attachment), SCSI (Small Computer System Interface), RAID (Redundant Array of Independent Disks), an SSD (solid state disk), eSATA (External SATA), PCMCIA (Personal Computer Memory Card International Association), a USB (universal serial bus), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on.

The media processing unit 1170 may process the data processed in the processor 1100 or the data inputted in the forms of image, voice and others from the external input device and output the data to the external interface device. The media processing unit 1170 may include a graphic processing unit (GPU), a digital signal processor (DSP), a high definition audio device (HD audio), a high definition multimedia interface (HDMI) controller, and so on.

Figure 10:
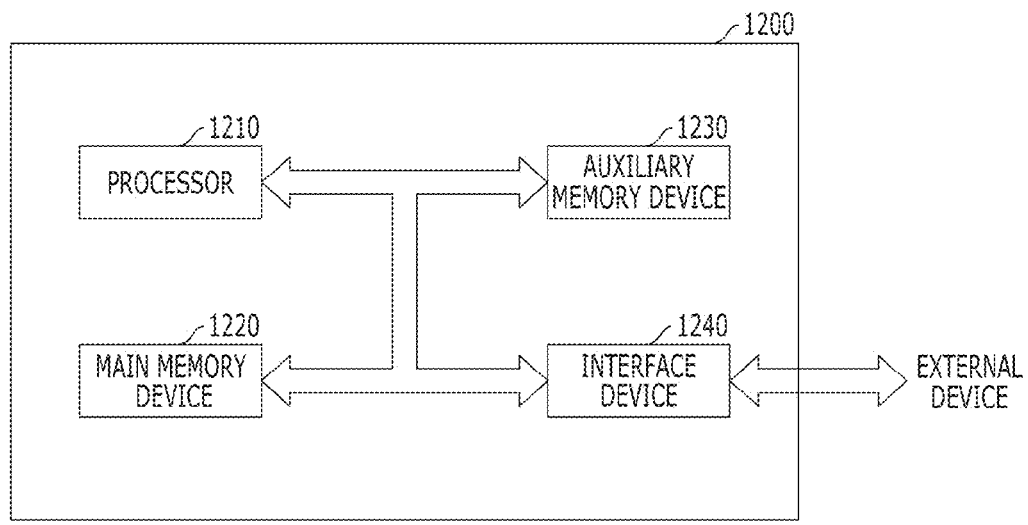
FIG. 10 shows an example of a configuration diagram of a system implementing memory circuitry based on the disclosed technology.

FIG. 10 is a configuration diagram of a system based on another implementation of the disclosed technology.

Referring to FIG. 10, a system 1200 as an apparatus for processing data may perform input, processing, output, communication, storage, etc. to conduct a series of manipulations for data. The system 1200 may include a processor 1210, a main memory device 1220, an auxiliary memory device 1230, an interface device 1240, and so on. The system 1200 of the present implementation may be various electronic systems which operate using processors, such as a computer, a server, a PDA (personal digital assistant), a portable computer, a web tablet, a wireless phone, a mobile phone, a smart phone, a digital music player, a PMP (portable multimedia player), a camera, a global positioning system (GPS), a video camera, a voice recorder, a telematics, an audio visual (AV) system, a smart television, and so on.

The processor 1210 decodes inputted commands and processes operation, comparison, etc. for the data stored in the system 1200, and controls these operations. The processor 1210 may include a microprocessor unit (MPU), a central processing unit (CPU), a single/multi-core processor, a graphic processing unit (GPU), an application processor (AP), a digital signal processor (DSP), and so on.

The main memory device 1220 is a storage which can temporarily store, call and execute program codes or data from the auxiliary memory device 1230 when programs are executed and can conserve memorized contents even when power supply is cut off. The main memory device 1220 may include one or more of the above-described semiconductor devices in accordance with the implementations. For example, the main memory device 1220 implementation may include a plurality of normal columns each including a plurality of resistive memory cells, a reference column including a plurality of resistive memory cells in which, before performing a read operation, data of a first state is stored in one of resistive memory cells disposed at two ends of the reference column and data of a second state is stored in the other resistive memory cell, and a data sensing circuit configured to sense data using current flowing through a normal column selected among the plurality of normal columns and current flowing through the reference column, in the read operation. Since it is possible to generate precise reference current using only one reference column, the area of a circuit may be reduced. Through this, the area of the main memory device 1220 may be reduced. Since the main memory device 1220 according to the present implementation may be reduced in area, the system 1200 may be reduced in size.

Also, the main memory device 1220 may further include a static random access memory (SRAM), a dynamic random access memory (DRAM), and so on, of a volatile memory type in which all contents are erased when power supply is cut off. Unlike this, the main memory device 1220 may not include the semiconductor devices according to the implementations, but may include a static random access memory (SRAM), a dynamic random access memory (DRAM), and so on, of a volatile memory type in which all contents are erased when power supply is cut off.

The auxiliary memory device 1230 is a memory device for storing program codes or data. While the speed of the auxiliary memory device 1230 is slower than the main memory device 1220, the auxiliary memory device 1230 can store a larger amount of data. The auxiliary memory device 1230 may include one or more of the above-described semiconductor devices in accordance with the implementations. For example, the auxiliary memory device 1230 implementation may include a plurality of normal columns each including a plurality of resistive memory cells, a reference column including a plurality of resistive memory cells in which, before performing a read operation, data of a first state is stored in one of resistive memory cells disposed at two ends of the reference column and data of a second state is stored in the other resistive memory cell, and a data sensing circuit configured to sense data using current flowing through a normal column selected among the plurality of normal columns and current flowing through the reference column, in the read operation. Since it is possible to generate precise reference current using only one reference column, the area of a circuit may be reduced. Through this, the area of the auxiliary memory device 1230 may be reduced. Since the auxiliary memory device 1230 according to the present implementation may be reduced in area, the system 1200 may be reduced in size.

Also, the auxiliary memory device 1230 may further include a data storage system (see the reference numeral 1300 of FIG. 14) such as a magnetic tape using magnetism, a magnetic disk, a laser disk using optics, a magneto-optical disc using both magnetism and optics, a solid state disk (SSD), a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on. Unlike this, the auxiliary memory device 1230 may not include the semiconductor devices according to the implementations, but may include data storage systems (see the reference numeral 1300 of FIG. 10) such as a magnetic tape using magnetism, a magnetic disk, a laser disk using optics, a magneto-optical disc using both magnetism and optics, a solid state disk (SSD), a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on.

The interface device 1240 may be to perform exchange of commands and data between the system 1200 of the present implementation and an external device. The interface device 1240 may be a keypad, a keyboard, a mouse, a speaker, a mike, a display, various human interface devices (HIDs), a communication device and so on. The communication device may include a module capable of being connected with a wired network, a module capable of being connected with a wireless network and both of them.

The wired network module may include a local area network (LAN), a universal serial bus (USB), an Ethernet, power line communication (PLC), such as various devices which send and receive data through transmit lines, and so on. The wireless network module may include Infrared Data Association (IrDA), code division multiple access (CDMA), time division multiple access (TDMA), frequency division multiple access (FDMA), a wireless LAN, Zigbee, a ubiquitous sensor network (USN), Bluetooth, radio frequency identification (RFID), long term evolution (LTE), near field communication (NFC), a wireless broadband Internet (Wibro), high speed downlink packet access (HSDPA), wideband CDMA (WCDMA), ultra wideband (UWB), such as various devices which send and receive data without transmit lines, and so on.

Figure 11:
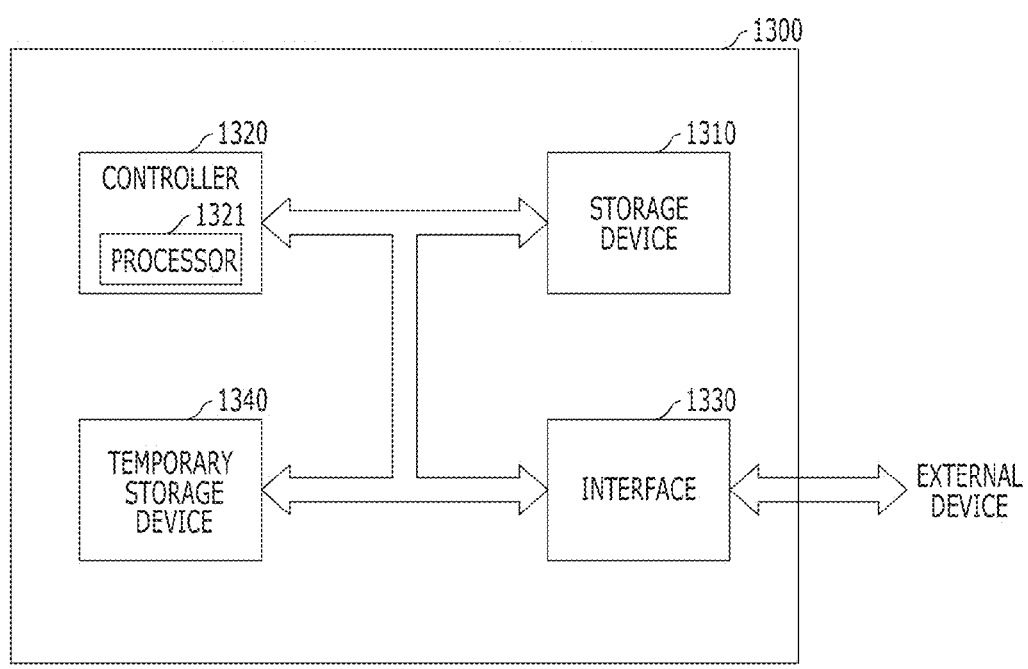
FIG. 11 shows an example of a configuration diagram of a data storage system implementing memory circuitry based on the disclosed technology.

FIG. 11 is a configuration diagram of a data storage system based on another implementation of the disclosed technology.

Referring to FIG. 11, a data storage system 1300 may include a storage device 1310 which has a nonvolatile characteristic as a component for storing data, a controller 1320 which controls the storage device 1310, an interface 1330 for connection with an external device, and a temporary storage device 1340 for storing data temporarily. The data storage system 1300 may be a disk type such as a hard disk drive (HDD), a compact disc read only memory (CDROM), a digital versatile disc (DVD), a solid state disk (SSD), and so on, and a card type such as a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on.

The storage device 1310 may include a nonvolatile memory which stores data semi-permanently. The nonvolatile memory may include a ROM (read only memory), a NOR flash memory, a NAND flash memory, a phase change random access memory (PRAM), a resistive random access memory (RRAM), a magnetic random access memory (MRAM), and so on.

The controller 1320 may control exchange of data between the storage device 1310 and the interface 1330. To this end, the controller 1320 may include a processor 1321 for performing an operation for, processing commands inputted through the interface 1330 from an outside of the data storage system 1300 and so on.

The interface 1330 is to perform exchange of commands and data between the data storage system 1300 and the external device. In the case where the data storage system 1300 is a card type, the interface 1330 may be compatible with interfaces which are used in devices, such as a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on, or be compatible with interfaces which are used in devices similar to the above mentioned devices.

In the case where the data storage system 1300 is a disk type, the interface 1330 may be compatible with interfaces, such as IDE (Integrated Device Electronics), SATA (Serial Advanced Technology Attachment), SCSI (Small Computer System Interface), eSATA (External SATA), PCMCIA (Personal Computer Memory Card International Association), a USB (universal serial bus), and so on, or be compatible with the interfaces which are similar to the above mentioned interfaces. The interface 1330 may be compatible with one or more interfaces having a different type from each other. The temporary storage device 1340 can store data temporarily implementation for efficiently transferring data between the interface 1330 and the storage device 1310 according to diversifications and high performance of an interface with an external device, a controller and a system. The temporary storage device 1340 for temporarily storing data may include one or more of the above-described semiconductor devices in accordance with the implementations. The temporary storage device 1340 implementation may include a plurality of normal columns each including a plurality of resistive memory cells, a reference column including a plurality of resistive memory cells in which, before performing a read operation, data of a first state is stored in one of resistive memory cells disposed at two ends of the reference column and data of a second state is stored in the other resistive memory cell, and a data sensing circuit configured to sense data using current flowing through a normal column selected among the plurality of normal columns and current flowing through the reference column, in the read operation. Since it is possible to generate precise reference current using only one reference column, the area of a circuit may be reduced. Through this, the area of the storage device 1310 or the temporary storage device 1340 may be reduced. Since the storage device 1310 or the temporary storage device 1340 according to the present implementation may be reduced in area, the data storage system 1300 may be reduced in size.

Figure 12:
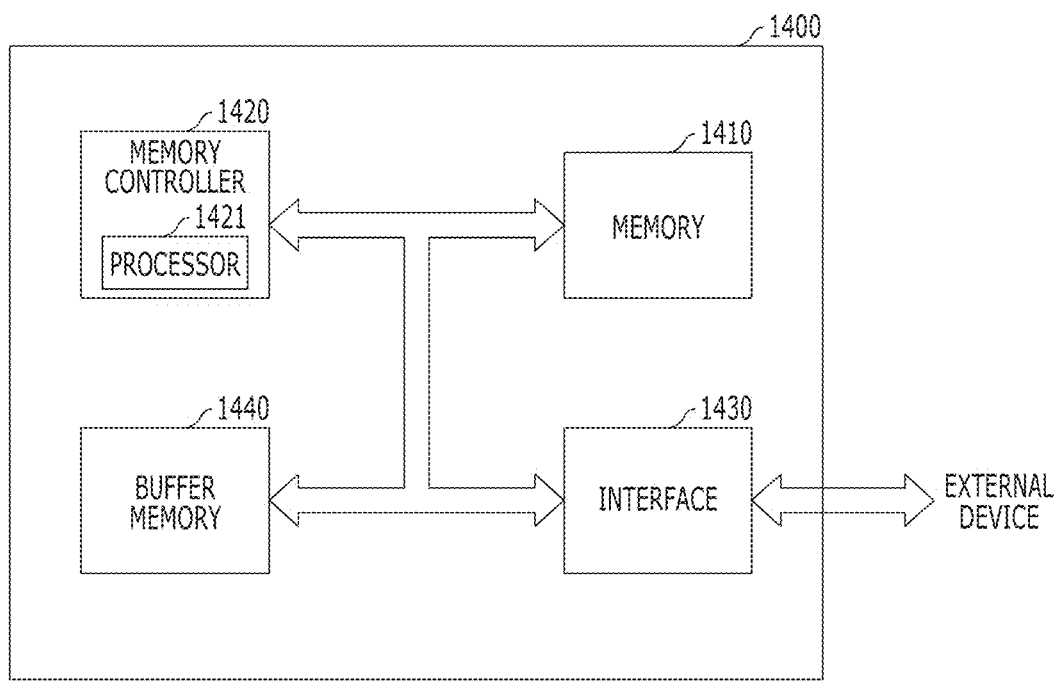
FIG. 12 shows an example of a configuration diagram of a memory system implementing memory circuitry based on the disclosed technology.

FIG. 12 is a configuration diagram of a memory system based on another implementation of the disclosed technology.

Referring to FIG. 12, a memory system 1400 may include a memory 1410 which has a nonvolatile characteristic as a component for storing data, a memory controller 1420 which controls the memory 1410, an interface 1430 for connection with an external device, and so on. The memory system 1400 may be a card type such as a solid state disk (SSD), a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on.

The memory 1410 for storing data may include one or more of the above-described semiconductor devices in accordance with the implementations. For example, the memory 1410 implementation may include a plurality of normal columns each including a plurality of resistive memory cells, a reference column including a plurality of resistive memory cells in which, before performing a read operation, data of a first state is stored in one of resistive memory cells disposed at two ends of the reference column and data of a second state is stored in the other resistive memory cell, and a data sensing circuit configured to sense data using current flowing through a normal column selected among the plurality of normal columns and current flowing through the reference column, in the read operation. Since it is possible to generate precise reference current using only one reference column, the area of a circuit may be reduced. Through this, the area of the memory 1410 may be reduced. Since the memory 1410 according to the present implementation may be reduced in area, the memory system 1400 may be reduced in size.

Also, the memory 1410 according to the present implementation may further include a ROM (read only memory), a NOR flash memory, a NAND flash memory, a phase change random access memory (PRAM), a resistive random access memory (RRAM), a magnetic random access memory (MRAM), and so on, which have a nonvolatile characteristic.

The memory controller 1420 may control exchange of data between the memory 1410 and the interface 1430. To this end, the memory controller 1420 may include a processor 1421 for performing an operation for and processing commands inputted through the interface 1430 from an outside of the memory system 1400.

The interface 1430 is to perform exchange of commands and data between the memory system 1400 and the external device. The interface 1430 may be compatible with interfaces which are used in devices, such as a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC) an embedded MMC (eMMC), a compact flash (CF) card, and so on, or be compatible with interfaces which are used in devices similar to the above mentioned devices. The interface 1430 may be compatible with one or more interfaces having a different type from each other.

The memory system 1400 according to the present implementation may further include a buffer memory 1440 for efficiently transferring data between the interface 1430 and the memory 1410 according to diversification and high performance of an interface with an external device, a memory controller and a memory system. For example, the buffer memory 1440 for temporarily storing data may include one or more of the above-described memory circuits in accordance with the implementations. The buffer memory 1440 implementation may include a plurality of normal columns each including a plurality of resistive memory cells, a reference column including a plurality of resistive memory cells in which, before performing a read operation, data of a first state is stored in one of resistive memory cells disposed at two ends of the reference column and data of a second state is stored in the other resistive memory cell, and a data sensing circuit configured to sense data using current flowing through a normal column selected among the plurality of normal columns and current flowing through the reference column, in the read operation. Since it is possible to generate precise reference current using only one reference column, the area of a circuit may be reduced, the memory system 1400 may be reduced in size.

Moreover, the buffer memory 1440 according to the present implementation may further include an SRAM (static random access memory), a DRAM (dynamic random access memory), and so on, which have a volatile characteristic, and a phase change random access memory (PRAM), a resistive random access memory (RRAM), a spin transfer torque random access memory (STTRAM), a magnetic random access memory (MRAM), and so on, which have a nonvolatile characteristic. Unlike this, the buffer memory 1440 may not include the semiconductor devices according to the implementations, but may include an SRAM (static random access memory), a DRAM (dynamic random access memory), and so on, which have a volatile characteristic, and a phase change random access memory (PRAM), a resistive random access memory (RRAM), a spin transfer torque random access memory (STTRAM), a magnetic random access memory (MRAM), and so on, which have a nonvolatile characteristic.

Features in the above examples of electronic devices or systems in FIGS. 8-12 based on the memory devices disclosed in this document may be implemented in various devices, systems or applications. Some examples include mobile phones or other portable communication devices, tablet computers, notebook or laptop computers, game machines, smart TV sets, TV set top boxes, multimedia servers, digital cameras with or without wireless communication functions, wrist watches or other wearable devices with wireless communication capabilities.

While this patent document contains many specifics, these should not be construed as limitations on the scope of any invention or of what may be claimed, but rather as descriptions of features that may be specific to particular embodiments of particular inventions. Certain features that are described in this patent document in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or variation of a sub combination.

Similarly, while operations are depicted in the drawings in a particular order, this should not be understood as requiring that such operations be performed in the particular order shown or in sequential order, or that all illustrated operations be performed, to achieve desirable results. Moreover, the separation of various system components in the embodiments described in this patent document should not be understood as requiring such separation in all embodiments.

Only a few implementations and examples are described. Other implementations, enhancements and variations can be made based on what is described and illustrated in this patent document.

What is claimed is:

1. A reference column of a semiconductor memory, comprising:
a reference bit line;
a reference source line; and
first to $N^{th}$ resistive memory cells disposed in parallel between the reference bit line and the reference source line,
wherein data of a first state is stored in the first resistive memory cell and data of a second state is stored in the $N^{th}$ resistive memory cell before a read operation, and the first and $N^{th}$ resistive memory cells form current paths between the reference bit line and the reference source line in the read operation, and
wherein, in the read operation, the second to N−1th resistive memory cells do not form any current paths between the reference bit line and the reference source line.

2. The reference column according to claim 1,
wherein the first to $N^{th}$ resistive memory cells are disposed in a direction of the reference bit line, and
wherein the first resistive memory cell and the $N^{th}$ resistive memory cell are arranged at two ends of the reference column.

3. The reference column according to claim 1, wherein each of the first to $N^{th}$ resistive memory cells comprises:
a variable resistance element of which resistance value is changed according to a logic value of data stored therein; and
a switch element coupled in series to the variable resistance element.

4. The reference column according to claim 3, wherein, in the read operation, switch elements of the first resistive memory cell and the $N^{th}$ resistive memory cell are turned on, and switch elements of the second to N−1$^{th}$ resistive memory cells are turned off.

5. The reference column according to claim 3, wherein the variable resistance element includes at least one of a metal oxide and a phase change substance.

6. The reference column according to claim 1, wherein the reference bit line and the reference source line are formed parallel to each other.

7. An electronic device including a semiconductor memory, the semiconductor memory comprising:
a plurality of normal columns each including a plurality of resistive memory cells for storing data;
a single reference column for generating a reference current in a read operation of the normal columns, the reference column including a plurality of resistive memory cells among which two resistive memory cells disposed at two ends of the reference column store data of different states before performing a read operation; and
a data sensing circuit coupled to the normal columns for sensing a data current from a selected normal column and coupled to the reference column for receiving the reference current, the data sensing circuit operable to compare the data current flowing through the selected normal column with the reference current flowing through the reference column to determine a value of data in the read operation,
wherein, in the read operation, current flows through a selected resistive memory cell in the selected normal column, current flows through the two resistive memory cells and current does not follow through the remaining resistive memory cells of the single reference column.

8. The electronic device according to claim 7, wherein the reference column comprises:
a reference bit line; and
a reference source line.

9. The electronic device according to claim 7, wherein each of the plurality of resistive memory cells comprises:
a variable resistance element of which resistance value is changed according to a logic value of data stored therein; and
a switch element coupled in series to the variable resistance element.

10. The electronic device according to claim 7, wherein the data sensing circuit comprises:
a pre-sensing unit configured to generate a first voltage corresponding to the current flowing through the selected normal column;
a reference voltage generation unit configured to generate a second voltage corresponding to the current flowing through the reference column; and
a comparison unit configured to compare the first voltage and the second voltage and generate data.

11. The electronic device according to claim 9, wherein the variable resistance element comprises at least one of a metal oxide and a phase change substance.

12. The electronic device according to claim 7, further comprising a processor which includes:
a core unit configured to perform, based on a command inputted from an outside of the processor, an operation corresponding to the command, by using data;
a cache memory unit configured to store data for performing the operation, data corresponding to a result of performing the operation, or an address of data for which the operation is performed; and
a bus interface connected between the core unit and the cache memory unit, and configured to transmit data between the core unit and the cache memory unit,
wherein the semiconductor memory unit that includes the variable resistance element is part of the cache memory unit in the processor.

13. The electronic device according to claim 7, further comprising a processing system which includes:
a processor configured to decode a command received by the processor and control an operation for information based on a result of decoding the command;
an auxiliary memory device configured to store a program for decoding the command and the information;
a main memory device configured to call and store the program and the information from the auxiliary memory device such that the processor can perform the operation using the program and the information when executing the program; and
an interface device configured to perform communication between the processor, the auxiliary memory device or the main memory device and the outside,
wherein the semiconductor memory unit that includes the variable resistance element is part of the auxiliary memory device or the main memory device in the processing system.

14. The electronic device according to claim 7, further comprising a data storage system which includes:
a storage device configured to store data and conserve stored data regardless of power supply;

a controller configured to control input and output of data to and from the storage device according to a command inputted form an outside;

a temporary storage device configured to temporarily store data exchanged between the storage device and the outside; and an interface configured to perform communication between at least one of the storage device, the controller and the temporary storage device and the outside, wherein the semiconductor memory unit that includes the variable resistance element is part of the storage device or the temporary storage device in the data storage system.

15. The electronic device according to claim 7, further comprising a memory system which includes:

a memory configured to store data and conserve stored data regardless of power supply;

a memory controller configured to control input and output of data to and from the memory according to a command inputted form an outside;

a buffer memory configured to buffer data exchanged between the memory and the outside; and an interface configured to perform communication between at least one of the memory, the memory controller and the buffer memory and the outside, wherein the semiconductor memory unit that includes the variable resistance element is part of the memory or the buffer memory in the memory system.

16. An electronic device including a semiconductor memory, the semiconductor memory comprising:

a normal column including resistive memory cells and providing a current flowing through a resistive memory cell in the normal column that is selected to store data;

a single reference column including resistive memory cells and providing a reference current flowing through the single reference column; and a data sensing circuit comparing the current with a value associated with the reference current to determine data stored in the selected resistive memory cell, wherein among the resistive memory cells of the single reference column, two resistive memory cells which are arranged at first and last rows of the reference column are turned on during a read operation and the remaining memory cells of the single reference column are turned off during the read operation.

17. The electronic device of claim 16, wherein the two resistive memory cells have data of different states stored therein prior to the read operation.

* * * * *